US008760219B2

(12) United States Patent
Chao

(10) Patent No.: US 8,760,219 B2
(45) Date of Patent: Jun. 24, 2014

(54) CURRENT PROVIDING CIRCUIT AND VOLTAGE PROVIDING CIRCUIT

(75) Inventor: Kuang-Wei Chao, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/543,887

(22) Filed: Jul. 9, 2012

(65) Prior Publication Data

US 2014/0009190 A1    Jan. 9, 2014

(51) Int. Cl.
*G05F 1/10*    (2006.01)

(52) U.S. Cl.
USPC .......................................... 327/540; 327/541

(58) Field of Classification Search
CPC .................................. G05F 1/575; G05F 1/56
USPC ......... 327/538, 540, 541, 543, 545, 546, 143, 327/198
See application file for complete search history.

(56) References Cited

U.S. PATENT DOCUMENTS

| 4,990,847 | A  | * | 2/1991  | Ishimaru et al. | 323/314 |
| 5,485,117 | A  | * | 1/1996  | Furumochi       | 327/538 |
| 5,504,452 | A  | * | 4/1996  | Takenaka        | 327/541 |
| 6,316,956 | B1 | * | 11/2001 | Oglesbee        | 326/10  |
| 6,756,839 | B2 | * | 6/2004  | Hall et al.     | 327/538 |
| 7,859,325 | B2 | * | 12/2010 | Chiu et al.     | 327/540 |
| 2006/0220730 | A1 | * | 10/2006 | Lobb et al.     | 327/540 |
| 2008/0136472 | A1 | * | 6/2008  | Shor            | 327/156 |
| 2012/0169411 | A1 | * | 7/2012  | Fefer et al.    | 327/538 |

\* cited by examiner

*Primary Examiner* — Lincoln Donovan
*Assistant Examiner* — Jung H Kim
(74) *Attorney, Agent, or Firm* — Winston Hsu; Scott Margo

(57) ABSTRACT

A current providing circuit, for providing an output current at an output terminal, comprising: a current providing module, coupled to a first predetermined voltage level, for providing the output current according to the first predetermined voltage level and a control voltage transmitted to the current providing module; and a control voltage generating module, for generating the control voltage corresponding to the first predetermined voltage level and a threshold voltage of the current providing module.

14 Claims, 4 Drawing Sheets

(a)

(b)

CURRENT PROVIDING CIRCUIT AND VOLTAGE PROVIDING CIRCUIT

BACKGROUND OF THE INVENTION

1. Field of the Invention

The present invention relates to a current providing circuit and a voltage providing circuit, and particularly relates to a current providing circuit and a voltage providing circuit, that have turn on/turn off time period based on the characteristic for the device therein and a voltage the device therein is coupled.

2. Description of the Prior Art

FIG. 1(a) is a circuit diagram illustrating a prior art voltage providing circuit 100. As shown in FIG. 1(a), the voltage providing circuit 100 is utilized to provide an output voltage V_cell_H to a memory array 102, to charge the bit line capacitors of the memory array 102. In one example, the output voltage V_cell_H is provided to $1^{st}$ sense amplifiers of the memory array 102.

The voltage providing circuit 100 includes a regulator 101 and a current providing circuit 103 for suppressing voltage drop of the output voltage V_cell_H. The regulator 101, which includes an operational amplifier 105, a PMOSFET 107, and resistors 109, 111, is utilized to generate the output voltage V_cell_H. However, since the memory array 102 includes a lot of devices thus the output voltage V_cell_H may have a sudden drop due to charging for devices of the memory array 102 (ex. the bit line). Therefore, the current providing circuit 103, which has a PMOSFET 104 coupled to a voltage level Vccx, is provided to prevent the output voltage V_cell_H from dropping too much.

FIG. 1(b) is a schematic diagram illustrating the operation of the circuit shown in FIG. 1(a). As shown in FIG. 1(b), the output voltage V_cell_H drops when the regulator 101 turns on (the time period that the signal EN has a high voltage level). Simultaneously, the current providing circuit 103 also turns on (the time period that the signal XTR has a low voltage level, the PMOSFET 104 turns on), such that the output voltage V_cell_H can be raised up.

However, the time period for turning on the current providing circuit 103 is hard to be controlled. If the PMOSFET 104 turns on for a time period that is too long, the output voltage V_cell_H is raised too much. On the contrary, if the PMOSFET 104 turns on for a time period that is too short, the output voltage V_cell_H is too low. The performance of other devices may be affected due to incorrect output voltage V_cell_H. In the worst case, the devices may have no function, if the output voltage V cell H is too high or too low. Also, many parameters such as the value of Vccx, the characteristics for the PMOSFET in the current providing circuit, and the value of real time output voltage V_cell_H may affect the voltage raising speed of the current providing circuit 103. Also, the variation caused by environment parameters such as temperature, or the variation caused by the process for the bit line capacitors and the PMOSFET are different. Such that the controlling of the current providing circuit 103 is more complicated.

Therefore, a current providing circuit with better control mechanism is needed.

SUMMARY OF THE INVENTION

Therefore, one objective of the present invention is to provide a current providing circuit with a good turn on time period control mechanism.

One embodiment of the present invention discloses a current providing circuit, for providing an output current at an output terminal, comprising: a current providing module, coupled to a first predetermined voltage level, for providing the output current according to the first predetermined voltage level and a control voltage (XTOR) transmitted to the current providing module; and a control voltage generating module, for generating the control voltage corresponding to the first predetermined voltage level and a threshold voltage of the current providing module.

Another embodiment of the present invention discloses a voltage providing circuit, for providing an output voltage to a loading device, comprising; a regulator, for providing the output voltage; a voltage drop suppressing module, coupled to a first predetermined voltage level, for suppressing a voltage drop of the output voltage according to the first predetermined voltage level and a control voltage transmitted to the voltage drop suppressing module; and a control voltage generating module, for generating the control voltage corresponding to the first predetermined voltage level and a threshold voltage of the voltage drop suppressing module In view of above-mentioned embodiments, the time period for turning on/turning off for the current providing module can be well controlled, since the control voltage for controlling the current providing module can vary corresponding to the value of the voltage received by the current providing module, the characteristics for the device in the current providing module, and the value of real time output voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
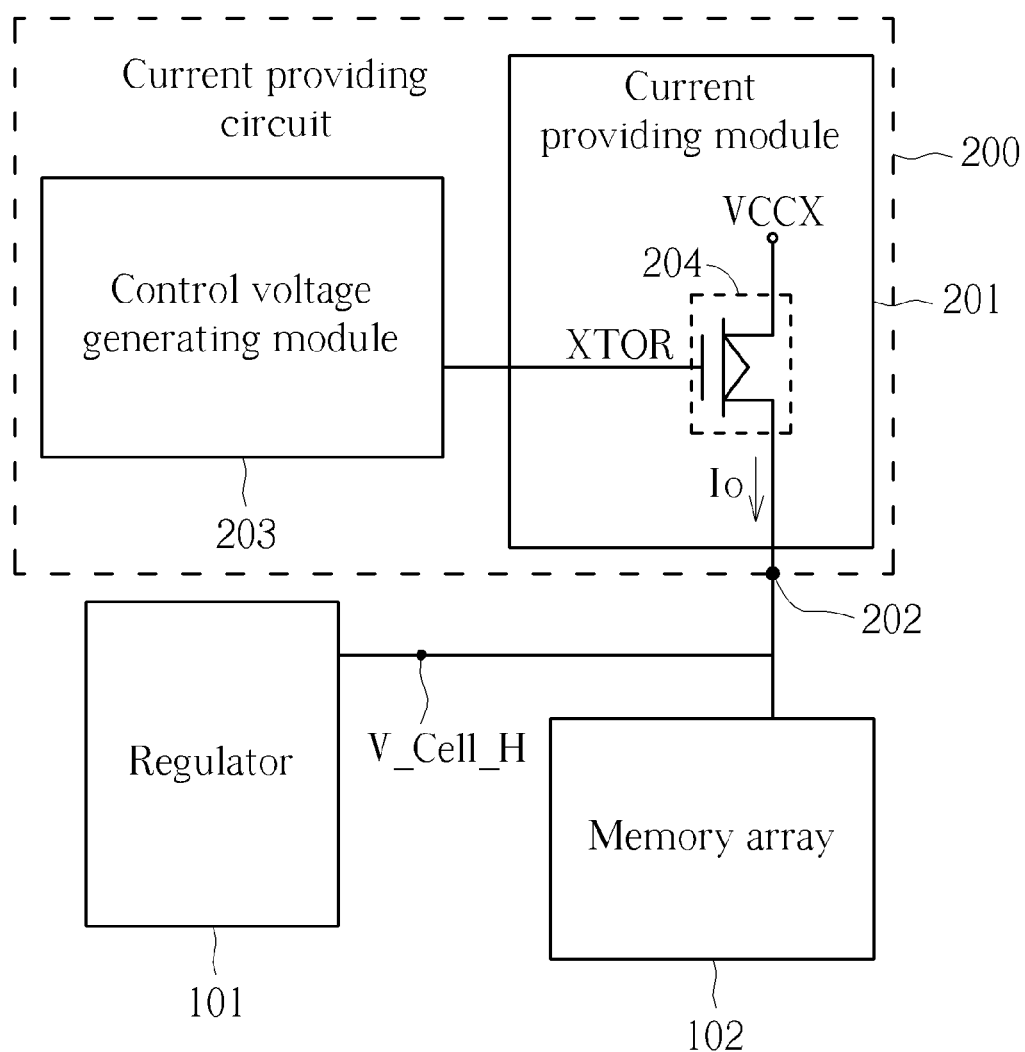
FIG. 2 is a block diagram illustrating a current providing circuit according to one embodiment of the present invention.

FIG. 2 is a block diagram illustrating a current providing circuit 200 according to one embodiment of the present invention. Please note the current providing circuit 200 is also coupled to a regulator 101 which provides an output voltage V_cell_H to a memory 102, therefore the current providing circuit 200 is also for suppressing voltage drop for the output voltage V_cell_H. However, it does mean that the current providing circuit according to the present invention is limited to such application.

Figure 1:
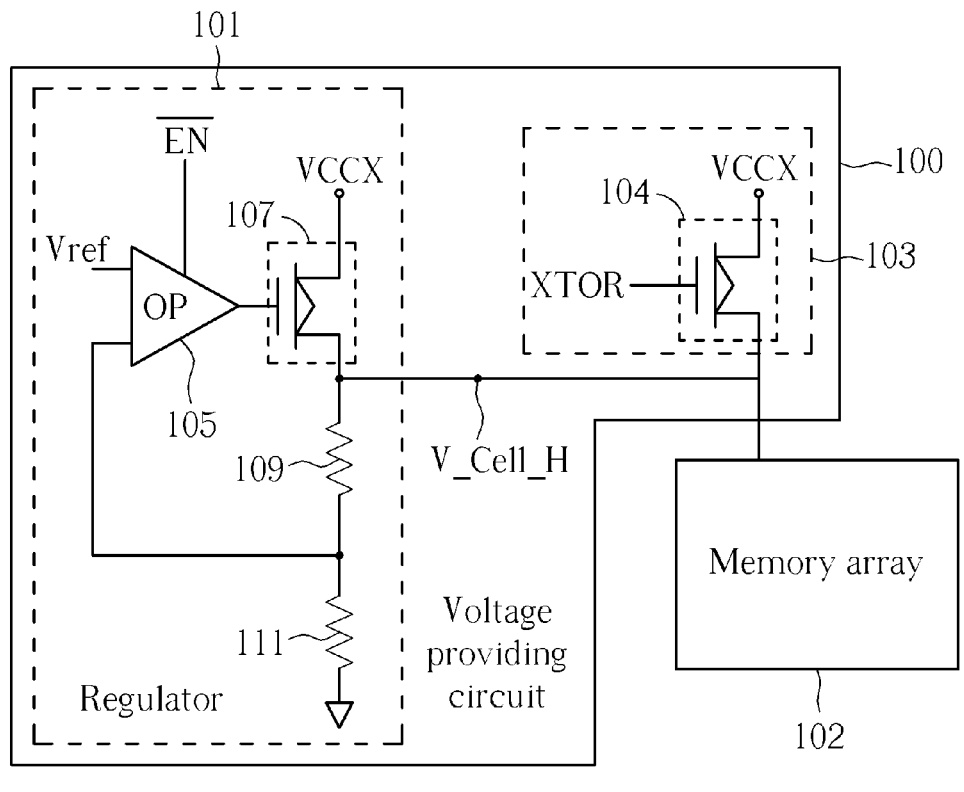
FIG. 1(a) is a circuit diagram illustrating a prior art voltage providing circuit.
FIG. 1(b) is a schematic diagram illustrating the operation of the circuit shown in FIG. 1(a).
Figure 1:
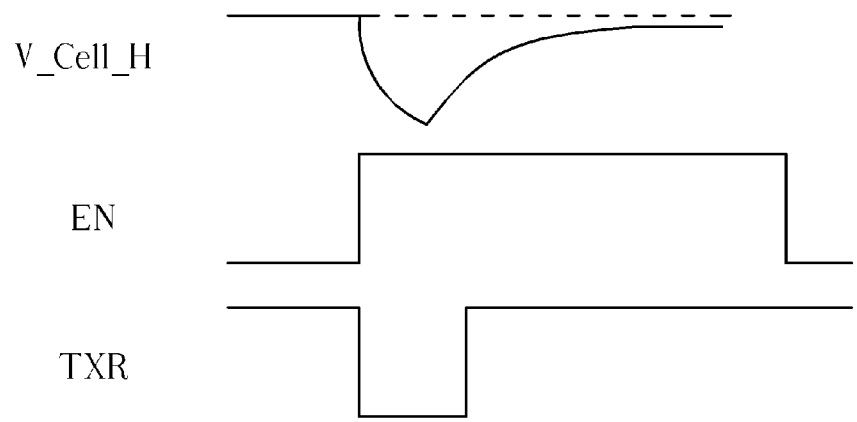

As shown in FIG. 2, the current providing circuit 200 includes a current providing module 201 and a control voltage generating module 203. The current providing module 201 has the same device and structure with which of the current providing circuit 103. That is, the current providing module 201 has a PMOSFET 204(also can be other kinds of transistors) coupled to a first predetermined voltage level Vccx, to provide the output current I when it turns on. If the output terminal 202 is coupled to the memory array 102 and the regulator 101 shown in FIG. 1, the current I can affect the output voltage V_cell_H based on the loading of the memory array 102. In this case, the current providing circuit 200 and the regulator 101 can be regarded as a voltage providing circuit.

The control voltage generating module 203 generates the control voltage XTOR corresponding to the first predetermined voltage level Vccx and a threshold voltage of the current providing module 201. In this embodiment, the threshold voltage of the current providing module 201 is the threshold value of the PMOSFET 204, but it can be other threshold values if the current providing module 201 includes other devices.

Figure 3:
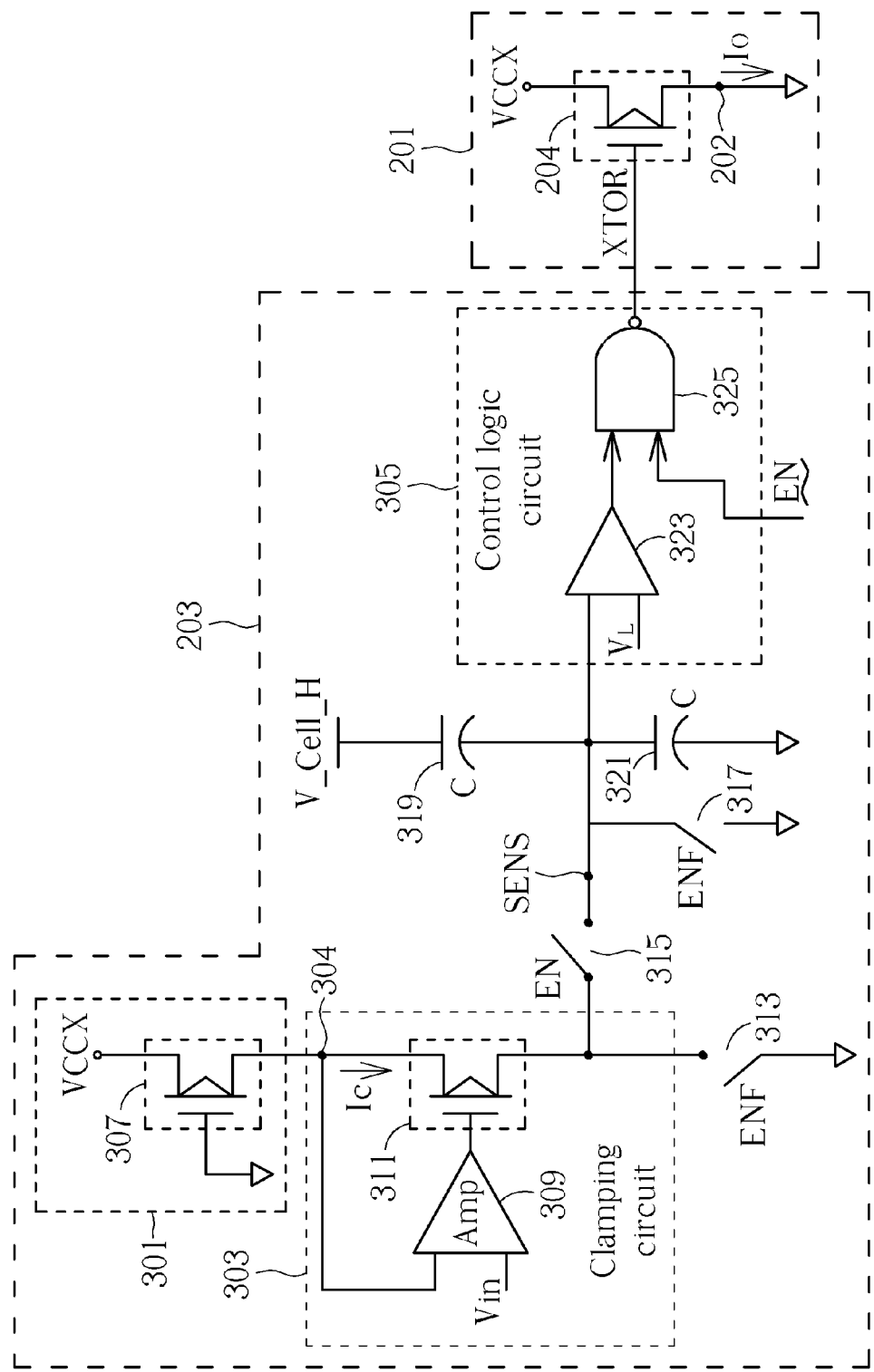
FIG. 3 is a circuit diagram illustrating exemplary circuit structures for the embodiment shown in FIG. 2.

FIG. 3 is a circuit diagram illustrating exemplary circuit structures for the embodiment shown in FIG. 2. As shown in FIG. 3, the control voltage generating module 203 includes a replica current providing module 301, a clamping circuit 303, a control logic circuit 305, switches 313, 315, 317, and capacitors 319, 321. The replica current providing module 301 is part of the current providing module 201. In one embodiment, the current providing module 201 includes a lot of fingers and the replica current providing module 301 includes at least one of the fingers. The finger indicates a structure for the layout of an electronic device, and the explanation thereof is omitted for brevity here since it is well know by persons skilled in the art. The clamping circuit 303 is utilized to clamp the voltage at the control current generating terminal 304 to an input voltage Vin. The control logic circuit 305 includes a voltage detector 323, and a NAND gate 325. The voltage detector 323 compares a charging voltage at the point SENS and a reference voltage VL to generate a comparing result to the NAND gate 325. The NAND gate 325 generates the control voltage XTOR according to the comparing result from the voltage detector 323. Additionally, the control logic circuit 305 receives an enable signal EN that can be utilized to turn on/turn off the current providing module 201.

Figure 4:
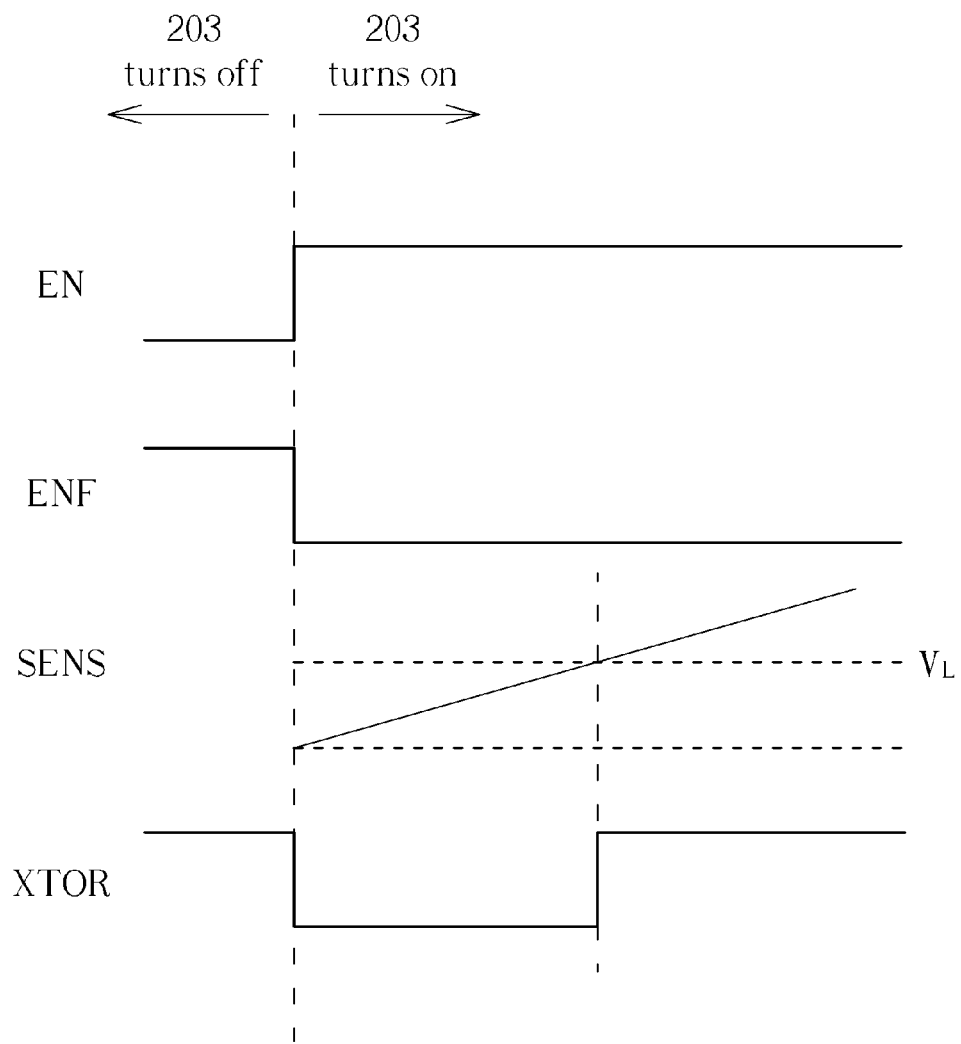
FIG. 4 is a schematic diagram illustrating the operation of the circuit shown in FIG. 3.

The operation of the control voltage generating module 203 shown in FIG. 3 is depicted as follows. Please also refer to the schematic diagram in FIG. 4, which illustrates the operation of the circuit in FIG. 3 to understand the concept of the present invention more clearly. The switches 313, 317 receives the signals ENF and the switch 315 receives the signal EN. If the control voltage generating module 203 turns off, the signal ENF is high and the signal EN is low, such that the switch 315 is not conductive and the switches 313, 317 are conductive. In this case, the control current IC flows to the ground, and the capacitors 319, 321 are also grounded.

If the control voltage generating module 203 turns on, the signal ENF is low and the signal EN is high, such that the switch 315 is conductive and the switches 313, 317 are not conductive. In this case, the replica current providing module 301 generates the control current IC, which is highly dependent on the first predetermined voltage level Vccx and the threshold value of the current providing module 201, since the replica current providing module 301 is part of the current providing module 201. The control current IC charges the capacitors 319 and 321, such that the charging voltage at the point SENS increases. In one embedment, one terminal of the capacitor 319 is coupled to the output voltage V_cell_H. In such case, the charging/discharging time of the capacitors 319, 321 relates to the output voltage V_cell_H, therefore the turning on/turning off time of the PMOSFET 204 can respond the real time output voltage V_cell_H.

The current providing module 201 turns on (the control voltage XTOR is low) when the charging voltage at the point SENS is lower than the reference voltage VL. However, the current providing module 201 turns off when the charging voltage at the point SENS reaches the reference voltage VL. In one embodiment, the reference voltage VL relates to the threshold value of the PMOSFET 204, therefore can help control the accurate turn on/turn off time of the PMOSFET 204.

Please note the circuit shown in FIG. 3 does not mean to limit the scope of the present invention. For example, the current providing module 201 and the replica current providing module 301 can have other devices rather than a PMOSFET. Additionally, the control voltage generating module 203 is not limited to have part of the current providing module 201 to generate the control voltage based on the first predetermined voltage Vccx and the threshold value of the current providing module 201. Other mechanism can be utilized to generate the control voltage based on the first predetermined voltage Vccx and the threshold value of the current providing module 201.

Also, other circuit structures can be implemented as the clamping circuit 303 and the control logic circuit 305 to perform the same function. Additionally, the capacitor 319 can be coupled to a predetermined voltage level rather than the output voltage V_cell_H. Moreover, one or both the capacitors 319, 321 can be omitted and the junction capacitor of the PMOSFET 311 or any other device can be charged by the control current IC to generate the charging voltage at the point SENS. Similar variation should also fall in the scope of the present invention.

In view of above-mentioned embodiments, the time period for turning on/turning off for the current providing module can be well controlled, since the control voltage for controlling the current providing module can vary corresponding to the value of the voltage received by the current providing module, the characteristics for the device in the current providing module, and the value of real time output voltage. Via these mechanisms, the total charge for the bit line capacitors, which depends on the capacitance value for the bit line capacitors and the output voltage V_Cell_H is almost fixed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current providing circuit, for providing an output current at an output terminal, comprising:
   a current providing module, coupled to a first predetermined voltage level, for providing the output current according to the first predetermined voltage level and a control voltage transmitted to the current providing module; and
   a control voltage generating module, for generating the control voltage corresponding to the first predetermined voltage level and a threshold voltage of the current providing module, comprising at least one part of the current providing module to generate a control current based on the first predetermined voltage level and the threshold voltage of the current providing module; wherein the control voltage generating module further generates the control voltage according to the control current;

wherein the control voltage generating module includes at least a capacitor, for generating a charging voltage according to the control current and a second predetermined voltage;

wherein the control voltage generating module comprises a voltage detector for receiving the charging voltage directly from the capacitor and comparing the charging voltage and a reference voltage, where the control voltage generating module generates the control voltage according to a voltage detecting result of the voltage detector;

wherein the control voltage generating module includes a control logic circuit comprising the voltage detector, for generating the control voltage according to the charging voltage; wherein the current providing module generates the output current only when the charging voltage is less than the reference voltage;

wherein the control logic circuit further comprises:
a NAND gate, for receiving the voltage detecting result and an enable signal to generate the control voltage according to the voltage detecting result and the enable signal.

2. The current providing circuit of claim 1, wherein the current providing module comprises a transistor for generating the output current based on the control voltage and the first predetermined voltage level, wherein the threshold voltage of the current providing module is a threshold voltage of the transistor.

3. The current providing circuit of claim 2,
wherein the transistor has a plurality of fingers and the control voltage generating module comprises at least one of the fingers as a replica transistor to provide the control current at a control current generating terminal, corresponding to the first predetermined voltage level and the threshold voltage of the transistor;
wherein the control voltage generating module generates the control voltage according to the control current.

4. The current providing circuit of claim 3, wherein the control voltage generating module includes a clamping circuit, for clamping a voltage of the control current generating terminal at an input voltage level.

5. The current providing circuit of claim 1, wherein the reference voltage is related with the threshold voltage of the transistor.

6. A voltage providing circuit for providing an output voltage to a loading device, wherein the voltage providing circuit comprises:
a regulator, for providing the output voltage;
a voltage drop suppressing module, coupled to a first predetermined voltage level, for suppressing a voltage drop of the output voltage according to the first predetermined voltage level and a control voltage transmitted to the voltage drop suppressing module; and
a control voltage generating module, for generating the control voltage corresponding to the first predetermined voltage level and a threshold voltage of the voltage drop suppressing module, and comprising at least one part of the voltage drop suppressing module to generate a control current based on the first predetermined voltage level and the threshold voltage of the voltage drop suppressing module, wherein the control voltage generating module further generates the control voltage according to the control current;

wherein the control voltage generating module includes at least a capacitor, for generating a charging voltage according to the control current and a second predetermined voltage;

wherein the control voltage generating module comprises a voltage detector for receiving the charging voltage directly from the capacitor and comparing the charging voltage and a reference voltage, where the control voltage generating module generates the control voltage according to a voltage detecting result of the voltage detector;

wherein the control voltage generating module includes a control logic circuit comprising the voltage detector, for generating the control voltage according to the charging voltage; wherein the voltage drop suppressing module turns on only when the charging voltage is less than the reference voltage;

wherein the control logic circuit further comprises:
a NAND gate, for receiving the voltage detecting result and an enable signal to generate the control voltage according to the voltage detecting result and the enable signal.

7. The voltage providing circuit of claim 6, wherein the voltage drop suppressing module comprises a transistor for suppressing the output voltage based on the control voltage and the first predetermined voltage level, wherein the threshold voltage of the voltage drop suppressing module is a threshold voltage of the transistor.

8. The voltage providing circuit of claim 7,
wherein the transistor has a plurality of fingers and the control voltage generating module comprises at least one of the fingers as a replica transistor to provide the control current at a control current generating terminal, corresponding to the first predetermined voltage level and the threshold voltage of the transistor;
wherein the control voltage generating module generates the control voltage according to the control current.

9. The voltage providing circuit of claim 8, wherein the control voltage generating module includes a clamping circuit, for clamping a voltage of the control current generating terminal at an input voltage level.

10. The voltage providing circuit of claim 6, wherein the reference voltage is related with the threshold voltage of the transistor.

11. A current providing circuit, for providing an output current at an output terminal, comprising:
a current providing module, coupled to a first predetermined voltage level, for providing the output current according to the first predetermined voltage level and a control voltage transmitted to the current providing module; and
a control voltage generating module, for generating the control voltage corresponding to the first predetermined voltage level and a threshold voltage of the current providing module;
wherein the current providing module comprises a transistor for generating the output current based on the control voltage and the first predetermined voltage level, wherein the threshold voltage of the current providing module is a threshold voltage of the transistor;
where the transistor has a plurality of fingers and the control voltage generating module comprises at least one of the fingers as a replica transistor to provide a control current at a control current generating terminal, corresponding to the first predetermined voltage level and the threshold voltage of the transistor;

wherein the control voltage generating module generates the control voltage according to the control current;

wherein the control voltage generating module includes a clamping circuit, for clamping a voltage of the control current generating terminal at an input voltage level;

wherein the control voltage generating module includes a control logic circuit, for generating the control voltage according to the charging voltage; wherein the current providing module generates the output current only when the charging voltage is less than a reference voltage;

wherein the control logic circuit comprises:
- a voltage detector, for detecting if the charging voltage is larger than the reference voltage to generate a voltage detecting result; and
- a NAND gate, for receiving the voltage detecting result and an enable signal to generate the control voltage according to the voltage detecting result and the enable signal.

12. The current providing circuit of claim 11, wherein the reference voltage is related with the threshold voltage of the transistor.

13. A voltage providing circuit for providing an output voltage to a loading device, wherein the voltage providing circuit comprises;
- a regulator, for providing the output voltage;
- a voltage drop suppressing module, coupled to a first predetermined voltage level, for suppressing a voltage drop of the output voltage according to the first predetermined voltage level and a control voltage transmitted to the voltage drop suppressing module; and
- a control voltage generating module, for generating the control voltage corresponding to the first predetermined voltage level and a threshold voltage of the voltage drop suppressing module;

wherein the voltage drop suppressing module comprises a transistor for suppressing the output voltage based on the control voltage and the first predetermined voltage level, wherein the threshold voltage of the voltage drop suppressing module is a threshold voltage of the transistor;

where the transistor has a plurality of fingers and the control voltage generating module comprises at least one of the fingers as a replica transistor to provide a control current at a control current generating terminal, corresponding to the first predetermined voltage level and the threshold voltage of the transistor;

wherein the control voltage generating module generates the control voltage according to the control current;

wherein the control voltage generating module includes a clamping circuit, for clamping a voltage of the control current generating terminal at an input voltage level;

wherein the control voltage generating module includes a control logic circuit, for generating the control voltage according to the charging voltage; wherein the voltage drop suppressing module turns on only when the charging voltage is less than a reference voltage; wherein the control logic circuit comprises:
- a voltage detector, for detecting if the charging voltage is larger than the reference voltage to generate a voltage detecting result; and
- a NAND gate, for receiving the voltage detecting result and an enable signal to generate the control voltage according to the voltage detecting result and the enable signal.

14. The voltage providing circuit of claim 13, wherein the reference voltage is related with the threshold voltage of the transistor.

* * * * *